US010811638B2

(12) United States Patent
Jung et al.

(10) Patent No.: US 10,811,638 B2
(45) Date of Patent: Oct. 20, 2020

(54) DISPLAY DEVICE INCLUDING POLARIZING UNIT WITH PORTIONS HAVING DIFFERENT TRANSMITTANCES

(71) Applicant: SAMSUNG DISPLAY CO., LTD., Yongin-si, Gyeonggi-do (KR)

(72) Inventors: Haegoo Jung, Seongnam-si (KR); Jangseok Ma, Hwaseong-si (KR); Dohyung Ryu, Yongin-si (KR); Jaewoo Song, Anyang-si (KR); Jaehoon Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/076,576

(22) Filed: Mar. 21, 2016

(65) Prior Publication Data

US 2016/0351856 A1    Dec. 1, 2016

(30) Foreign Application Priority Data

Jun. 1, 2015 (KR) .................. 10-2015-0077247

(51) Int. Cl.
| | |
|---|---|
| *H01L 51/52* | (2006.01) |
| *G02B 5/30* | (2006.01) |
| *H01L 27/12* | (2006.01) |
| *G02B 1/14* | (2015.01) |
| *H01L 27/32* | (2006.01) |

(52) U.S. Cl.
CPC ........ *H01L 51/5281* (2013.01); *G02B 5/3025* (2013.01); *G02B 5/3083* (2013.01); *H01L 27/124* (2013.01); *H01L 27/1248* (2013.01); *H01L 27/1255* (2013.01); *G02B 1/14* (2015.01); *H01L 27/3244* (2013.01)

(58) Field of Classification Search
None
See application file for complete search history.

(56) References Cited

U.S. PATENT DOCUMENTS

| | | | | |
|---|---|---|---|---|
| 9,019,255 | B2 * | 4/2015 | Hwang | G02B 5/205 257/E27.11 |
| 2007/0252925 | A1 * | 11/2007 | Takeda | G02F 1/133528 349/96 |
| 2008/0002114 | A1 * | 1/2008 | Kim | G02F 1/133528 349/113 |

(Continued)

FOREIGN PATENT DOCUMENTS

| | | |
|---|---|---|
| KR | 10-2011-0012526 A | 2/2011 |
| KR | 10-2013-0132108 A | 12/2013 |

(Continued)

OTHER PUBLICATIONS

Definition of "homopolymer" from Dictionary.com, available at URL: http://www.dictionary.com/browse/homopolymer.*

(Continued)

*Primary Examiner* — Erik Kielin
(74) *Attorney, Agent, or Firm* — Lewis Roca Rothgerber Christie LLP (57) ABSTRACT

A display device includes a display panel having a display surface, and a polarizing unit on the display surface of the display panel, the polarizing unit including a linear polarizer that includes at least two portions having different transmittances from each other.

10 Claims, 5 Drawing Sheets

(56) References Cited

U.S. PATENT DOCUMENTS

| | | | |
|---|---|---|---|
| 2011/0147721 A1* | 6/2011 | Han | G02B 5/3033 257/40 |
| 2012/0055607 A1* | 3/2012 | Kitagawa | B32B 41/00 156/64 |
| 2013/0120521 A1* | 5/2013 | Cope | G06F 3/1454 348/14.07 |
| 2013/0168712 A1* | 7/2013 | Jeong | H01L 51/5275 257/98 |
| 2013/0314647 A1 | 11/2013 | Yim et al. | |
| 2014/0346480 A1 | 11/2014 | Fukuda et al. | |
| 2015/0131035 A1* | 5/2015 | Chen | G02B 5/305 349/96 |
| 2015/0271392 A1* | 9/2015 | Musgrave | G09G 3/3208 348/207.11 |
| 2016/0195653 A1* | 7/2016 | Lee | G02B 5/305 359/486.01 |

FOREIGN PATENT DOCUMENTS

| | | |
|---|---|---|
| KR | 10-2014-0138041 A | 12/2014 |
| KR | 10-2014-0139410 A | 12/2014 |
| KR | 10-2014-0145077 A | 12/2014 |

OTHER PUBLICATIONS

Definition of "overlap" from Dicitonary.com; available at URL: https://www.dictionary.com/browse/overlap (Year: 2019).*

* cited by examiner

DISPLAY DEVICE INCLUDING POLARIZING UNIT WITH PORTIONS HAVING DIFFERENT TRANSMITTANCES

CROSS-REFERENCE TO RELATED APPLICATION

This application claims priority to, and the benefit of, Korean Patent Application No. 10-2015-0077247, filed on Jun. 1, 2015, with the Korean Intellectual Property Office, the disclosure of which is incorporated herein in its entirety by reference.

BACKGROUND

1. Field

Embodiments of the present invention relate to a display device including a polarizing unit, and to a method of manufacturing the display device.

2. Description of the Related Art

An organic light emitting diode ("OLED") display device is a self-emission-type display device that may display an image by using an OLED that emits light. Because of the omission of a separate light source, contrary to a liquid crystal display ("LCD") device, the OLED display device may have a relatively small thickness and a relatively light weight. Further, by virtue of its excellent characteristics, such as low power consumption, high luminance, high response speed, and the like, the OLED display device has drawn attention as a display device of the next generation.

The OLED display device generally includes electrodes of the OLED and various metal wirings, and such electrodes and metal wirings may reflect externally incident light (i.e., ambient light originating outside of the display device). Due to the reflection of the externally incident light, the OLED display device experiences difficulty in representing a black color in a relatively bright environment, and exhibits a relatively low contrast ratio.

To mitigate the abovementioned issues, a polarizing unit for reducing or preventing reflection of the external light is located on the OLED. However, due to the polarizing unit, an amount of light emitted from the OLED may decrease, and thus a greater amount of current may be required for light emission in the OLED display device. Accordingly, degradation of the OLED may be accelerated due to the increased current therethrough, which may cause image sticking (i.e., burn-in, or "ghosting"). In particular, the image sticking phenomenon may be aggravated at a position in which the same image, such as broadcasters logo, time, subtitles, etc., is displayed for a certain period of time.

It is to be understood that this background section is intended to provide useful background for understanding the technology, and as such, the technology background section may include ideas, concepts, or recognitions that were not part of what was known or appreciated by those skilled in the pertinent art prior to a corresponding effective filing date of subject matter disclosed herein.

SUMMARY

Aspects of embodiments of the present invention are directed to a display device capable of slackening or reducing degradation speed of an OLED.

According to an exemplary embodiment of the present invention, a display device includes a display panel having a display surface, and a polarizing unit on the display surface of the display panel, the polarizing unit including a linear polarizer that includes at least two portions having different transmittances from each other.

The at least two portions of the linear polarizer may include a first portion having a first transmittance, and a second portion having a second transmittance that is higher than the first transmittance.

The first portion may correspond to a center portion of the display panel, and the second portion may correspond to at least one corner portion of the display panel.

The first portion may corresponds to a center portion of the display panel, and the second portion may corresponds to at least one edge portion of the display panel.

The linear polarizer may include a polyvinyl alcohol-based ("PVA-based") resin, and a dichroic dye dyed to the PVA-based resin.

The PVA-based resin may include a homopolymer of vinyl acetate, or a copolymer of vinyl acetate and another monomer.

The dichroic dye may include iodine.

The polarizing unit may include an adhesive layer on the display panel, and a phase retardation layer on the adhesive layer.

The display panel may include a first substrate, a first electrode on the first substrate, an organic light emitting layer on the first electrode, and a second electrode on the organic light emitting layer.

The display device may further include a thin film encapsulation layer on the second electrode, the thin film encapsulation layer including at least one organic layer alternately stacked with at least one inorganic layer.

According to an exemplary embodiment of the present invention, a method of manufacturing a display device includes forming an adhesive layer on a display surface of a display panel, forming a phase retardation layer on the adhesive layer for imparting a phase difference, forming a linear polarizer including at least two portions having different transmittances, and forming a protection layer on the linear polarizer.

The forming of the linear polarizer may include uniaxially elongating a PVA-based resin film, dyeing the PVA-based resin film by adhering a dichroic dye thereto, and selectively detaching the dichroic dye adhered to the PVA-based resin film to form the at least two portions of the linear polarizer.

The dichroic dye may include iodine.

The selectively detaching the dichroic dye may include using visible light, ultraviolet (UV) ray, or laser.

The selectively detaching the dichroic dye may form a first portion having a first transmittance, and a second portion having a second transmittance that is higher than the first transmittance.

The first portion may correspond to a center portion of the display panel, and the second portion may correspond to at least one corner portion of the display panel.

The first portion may correspond to a center portion of the display panel, and the second portion may correspond to at least one edge portion of the display panel.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which:

FIG. 1 is an exploded perspective view illustrating a display device according to an exemplary embodiment.

DETAILED DESCRIPTION

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The display device according to an exemplary embodiment is described as including an organic light emitting diode ("OLED") display panel, but the present invention is not limited thereto. The display device according to the present invention may also be applied to a liquid crystal display panel, a plasma display panel, and an electrophoretic display panel.

Figure 1:
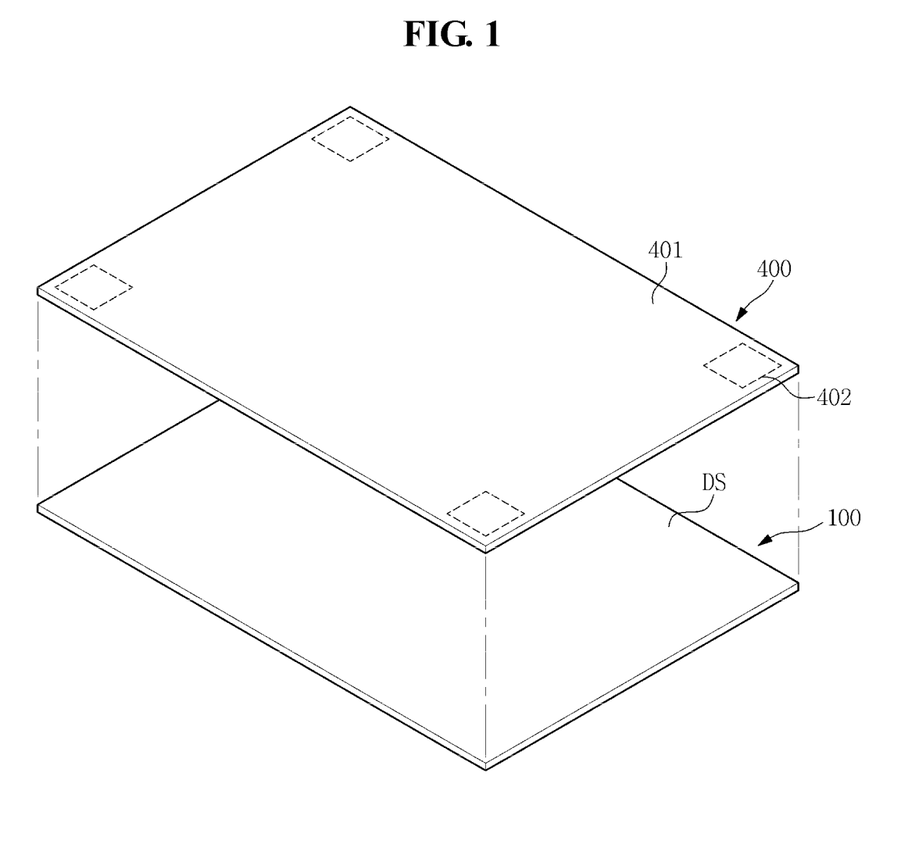
Figure 2:
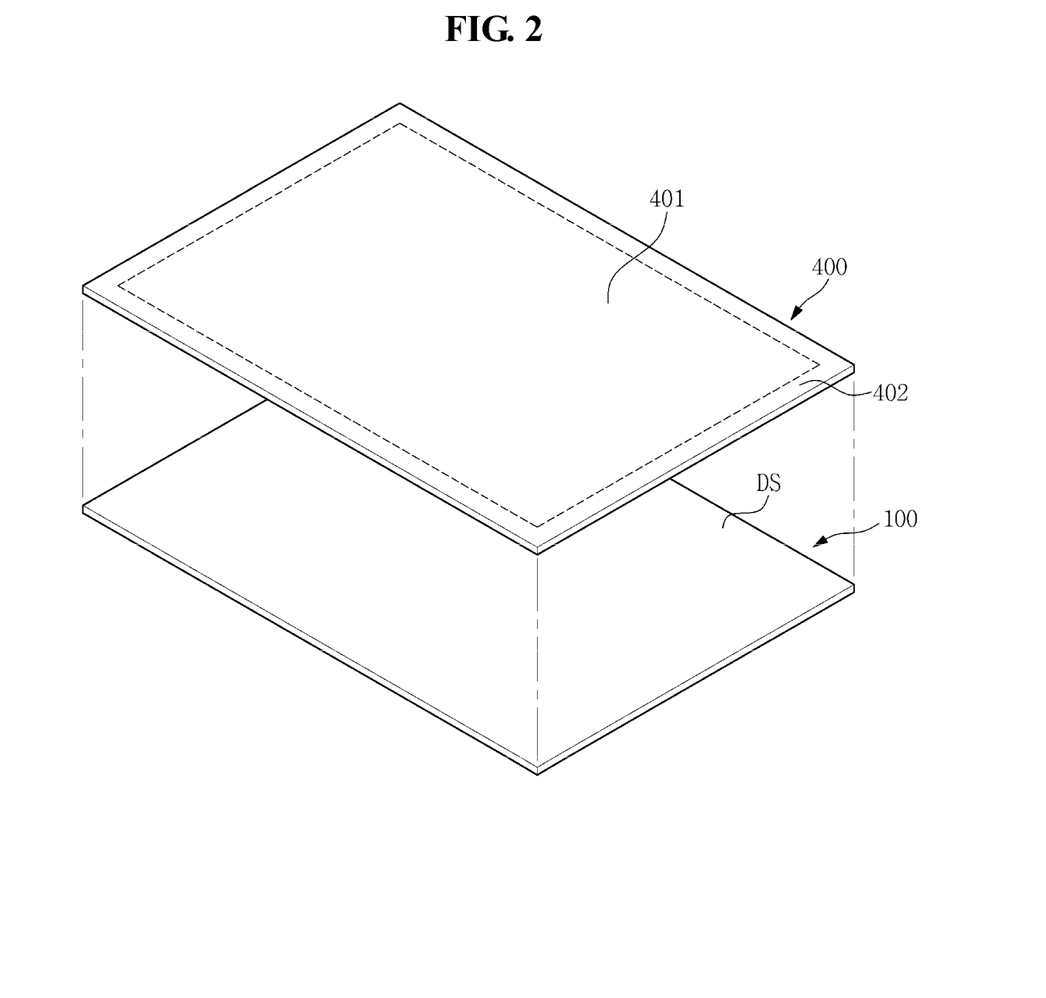
FIG. 2 is an exploded perspective view illustrating a display device according to another exemplary embodiment.

FIG. 1 is an exploded perspective view illustrating a display device according to an exemplary embodiment, and FIG. 2 is an exploded perspective view illustrating a display device according to another exemplary embodiment.

In reference to FIGS. 1 and 2, the display device according to exemplary embodiments includes a display panel 100 having a display surface DS, and a polarizing unit 400 on the display surface DS of the display panel 100.

The display panel 100 includes a substrate having a quadrangular planar shape, a plurality of OLEDs on the substrate in a matrix form, and a thin film transistor ("TFT") for driving the OLED. The configuration of the display panel 100 will be described further below.

Meanwhile, the OLED is degraded as time elapses, due to properties of a material forming an organic light emitting layer of the OLED, and due to the fact that the degradation speed/rate of the OLED is proportional to the time of light emission by the OLED. Accordingly, when the same image, such as broadcasters logo, time, subtitles, etc., is continuously displayed at the same position on the display panel 100, the degradation of the OLED at that position may be accelerated, thereby causing image sticking. The predetermined position may include, for example, at least one corner portion and/or at least one edge portion of the display panel 100.

The polarizing unit 400 is on the display surface DS of the display panel 100, and may have an area corresponding to the display panel 100. The polarizing unit 400 may include two or more portions that have different transmittances. For example, the polarizing unit 400 may include a first portion 401 having a first transmittance, and may also include a second portion 402 having a second transmittance that is higher than the first transmittance.

According to one embodiment, the first portion 401 of the polarizing unit 400 may correspond to a center portion of the display panel 100, and the second portion 402 of the polarizing unit 400 may correspond to at least one corner portion of the display panel 100 (refer to FIG. 1). However, the present invention is not limited thereto, and in alternative exemplary embodiments, the first portion 401 may correspond to the center portion of the display panel 100, and the second portion 402 may correspond to at least one edge portion of the display panel 100 (refer to FIG. 2). That is, a portion of the polarizing unit 400, which corresponds to a portion of the display panel 100 that has a higher probability of causing image sticking, has a transmittance that is higher than the transmittance of other portions of the polarizing unit 400. For example, the first portion 401 of the polarizing unit 400 may have a transmittance of less than about 50%, and the second portion 402 of the polarizing unit 400 may have a transmittance of about 50% or more.

Figure 3:
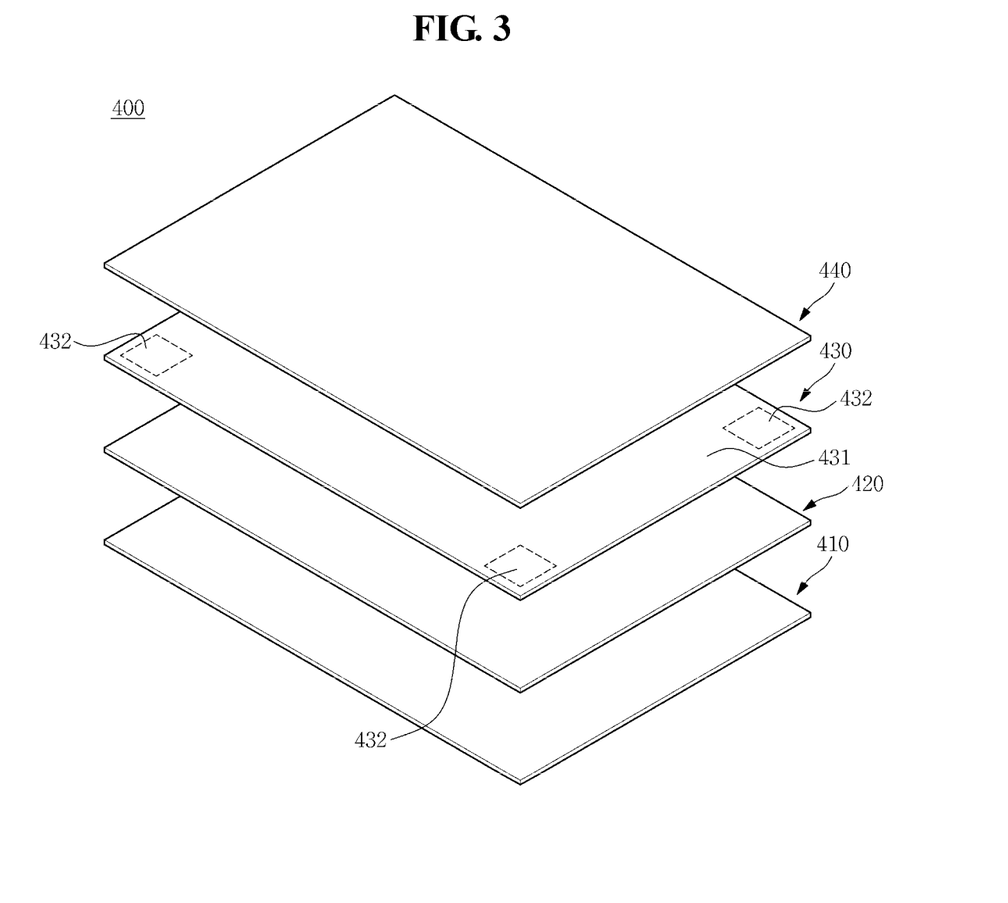
FIG. 3 is an exploded perspective view illustrating a polarizing unit according to an exemplary embodiment.

FIG. 3 is an exploded perspective view illustrating a polarizing unit 400 according to an exemplary embodiment.

In reference to FIG. 3, the polarizing unit 400 according to the present embodiment includes an adhesive layer 410 on a display panel, a phase retardation layer 420 on the adhesive layer 410, a linear polarizer 430 on the phase retardation layer 420, and a passivation layer 440 on the linear polarizer 430.

The adhesive layer 410 is configured to attach the polarizing unit 400 to the display panel, and may include, for example, at least one of an acryl-based adhesive, a vinyl ester-based adhesive, a silicon-based adhesive, and a urethane-based adhesive. The adhesive layer 410 may have a thickness in a range of about 50 nm to about 500 nm. When the thickenss of the adhesive layer 410 is less than 50 nm, the adhesive layer 410 might not provide sufficient adhesion. On the contrary, when the thickenss of the adhesive layer 410 is more than about 500 nm, the polarizing unit 400 may be too thick.

The polarizing unit 400 may further include a release layer on another surface of the adhesive layer 410. The release layer may protect the adhesive layer 410, and may be removed to expose the adhesive layer 410 prior to attaching the polarizing unit 400 to the display panel.

The phase retardation layer 420 is on the adhesive layer 410, and retards the phase of light. The phase retardation layer 420 may convert linearly-polarized light into circularly-polarized light, or may convert circularly-polarized light into linearly-polarized light.

For example, external light incident to the polarizing unit 400 may be linearly polarized by the linear polarizer 430, or may be circularly polarized by the phase retardation layer 420. The external light, which is circularly-polarized, may be reflected within the display panel as reflected light. During the process of reflection, the phase and the polarization axis of the circularly-polarized external light may be shifted. The reflected light having the shifted phase might not be transmitted through the polarizing unit 400, thus reducing or preventing reflection of the external light by virtue of the polarizing unit 400.

A phase difference plate having a film form may be used as the phase retardation layer 420. The phase difference plate may be formed by elongation of a film. For example, the phase difference plate may be formed by elongating a film formed of a polymer such as polycarbonate, polyvinyl alcohol, polystyrene, polymethyl methacrylate, polypropylene, polyolefin, polyarylate or polyamide. Further, a photocurable liquid crystal may be used to form the phase difference plate. For example, a liquid crystal may be aligned on a polymer-based film, and then a liquid crystal pattern may be formed thereon to thereby form the phase difference plate. The phase difference plate formed through such a manner may be a quarter wave plate QWP or a half wave plate HWP based on an alignment layer and based on alignment of the liquid crystal material.

According to the present embodiment, the quarter wave plate QWP may be used as the phase retardation plate 420. However, the present embodiment is not limited thereto, and thus the half wave plate HWP may be used as the phase retardation plate 420, or the quarter wave plate QWP and the half wave plate HWP may be used together.

The linear polarizer 430 is on the phase retardation layer 420, and is configured to linearly polarize external light incident to the polarizing unit 400. The linear polarizer 430 may use a film that is formed by oriented-adhering a dichroic dye onto a polyvinyl alcohol ("PVA")-based resin. Examples of the PVA-based resin may include a homopolymer of vinyl acetate, or a copolymer of vinyl acetate and another monomer. The linear polarizer 430 may include at least two portions having different transmittances, and may include a first portion 431 having a first transmittance, and may also include a second portion 432 having a second transmittance that is higher than the first transmittance.

The first portion 431 of the linear polarizer 430 may correspond to a center portion of the display panel, and the second portion 432 of the linear polarizer 430 may correspond to at least one corner portion of the display panel. However, the present invention is not limited thereto, and in alternative exemplary embodiments, the first portion 431 of the linear polarizer 430 may correspond to the center portion of the display panel, and the second portion 432 of the linear polarizer 430 may correspond to at least one edge portion of the display panel. That is, a portion of the linear polarizer 430 corresponding to the portion that has a higher probability of causing image sticking has a transmittance that is higher than the transmittance of other portions of the linear polarizer 430. For example, the first portion 431 of the linear polarizer 430 may have a transmittance of less than about 50%, and the second portion 432 of the linear polarizer 430 may have a transmittance of about 50% or more.

The linear polarizer 430 may include a PVA-based resin and a dichroic dye dyed to the PVA-based resin. The PVA-based resin may be one of a homopolymer of vinyl acetate, or a copolymer of vinyl acetate and another monomer, and the dichroic dye may be iodine, although the present invention is not limited thereto. In alternative exemplary embodiments, another dichroic dye known in the pertinent art may be utilized. The linear polarizer 430 may be formed through the following processes, for example: a process of uniaxially elongating a PVA-based resin film; a process of dyeing the PVA-based resin film with a dichroic dye to be adhered thereto; or a process of selectively detaching the dichroic dye adhered to the PVA-based resin film so as to form at least two portions having different transmittances.

When iodine is used as the dichroic dye, the PVA-based resin film is immersed in an aqueous solution containing iodine and/or potassium iodine and dyed. The dichroic dye adhered to the PVA-based resin film may be detached using one of visible light, ultraviolet (UV) ray, and laser. In this case, a mask may be used so as to selectively detach the dichroic dye.

The thickness of the linear polarizer 430 may vary based on a product to which the linear polarizer 430 is to be applied. For example, the linear polarizer 430 may have a thickness in a range of about 5 micrometers (μm) to about 40 μm. The linear polarizer 430 may use a commercially available product.

The protection layer 440 is on the linear polarizer 430, and is configured to protect the linear polarizer 430. A tri-acetyl cellulose ("TAC") film, which has excellent mechanical strength, may be used as the protection layer 440. Further, a surface of the protection layer 440 may be treated to have anti-glare properties and/or anti-reflective properties.

Figure 4:
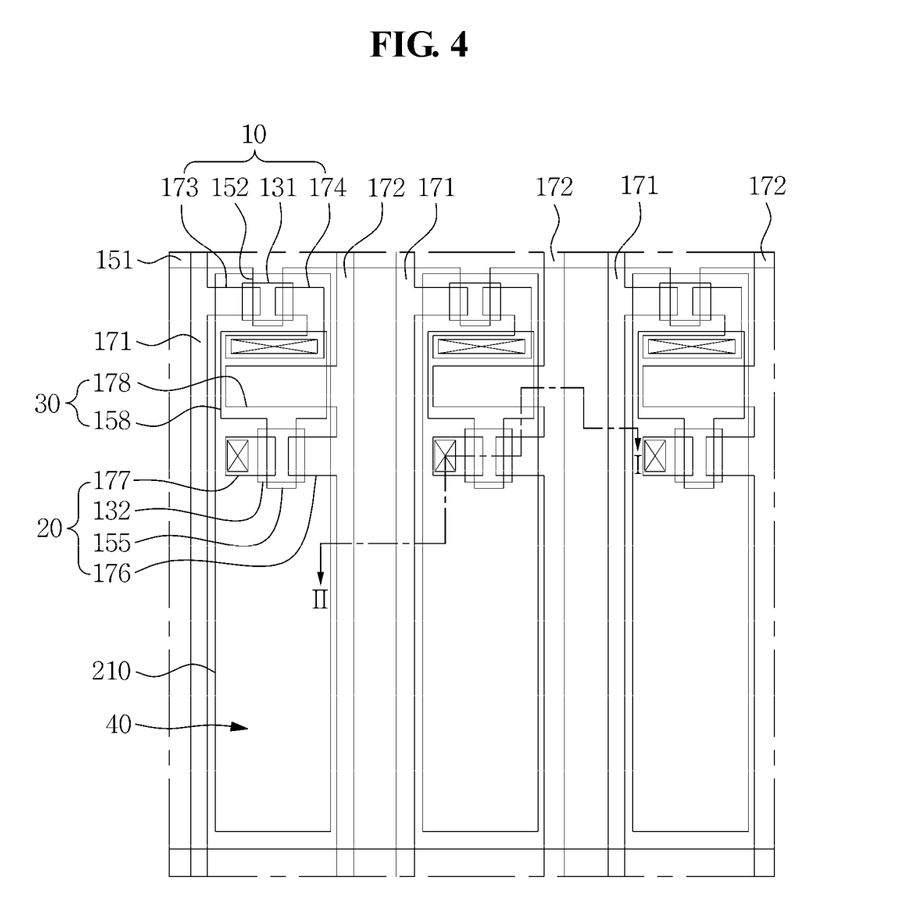
FIG. 4 is an enlarged view illustrating a portion of the display device according to an exemplary embodiment.
Figure 5:
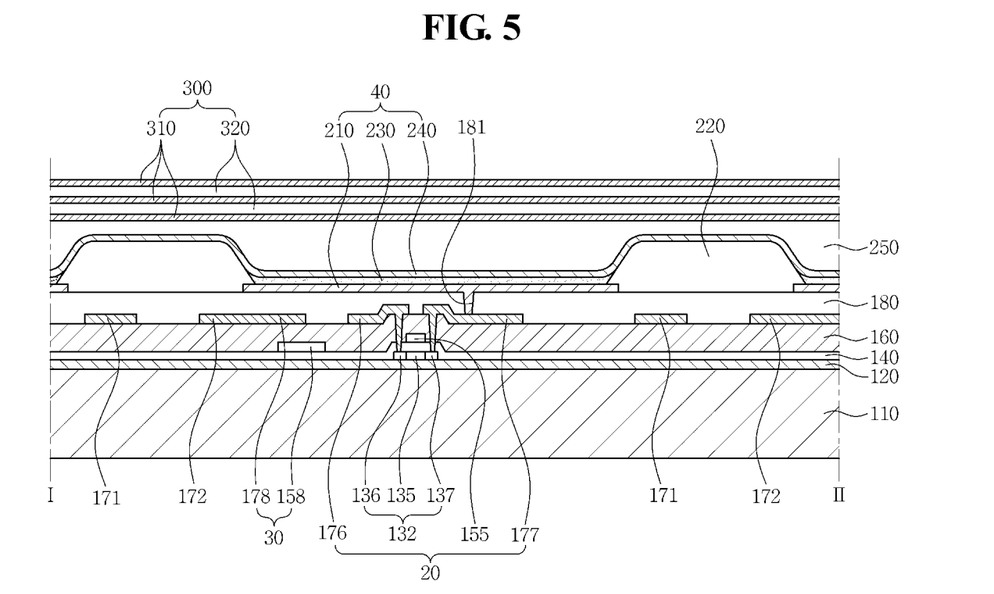
FIG. 5 is a cross-sectional view taken along the line I-II of FIG. 4.

FIG. 4 is an enlarged view illustrating a portion of a display device 100 according to an exemplary embodiment, and FIG. 5 is a cross-sectional view taken along the line I-II of FIG. 4.

The display panel 100 according to the present embodiment will be described with reference to FIGS. 4 and 5. The display panel 100 according to the present embodiment includes a switching TFT 10 on a first substrate 110, a driving TFT 20, a capacitor 30, and an OLED 40.

The first substrate 110 may include, or may be formed of, an insulating material selected from the group consisting of glass, quartz, ceramic, and plastic.

A buffer layer 120 is on the first substrate 110, and may serve to reduce or effectively prevent infiltration of undesirable elements, and may also serve to planarize a surface of the first substrate 110, and may include various materials that may be suitable to perform such functions. For example, the buffer layer 120 may include at least one of silicon nitrides ($SiN_x$), silicon oxides ($SiO_x$), and silicon oxynitride ($SiO_xN_y$). However, the buffer layer 120 is not invariably necessary, and may be omitted in other embodiments of the present invention.

A switching semiconductor layer 131 and a driving semiconductor layer 132 are formed on the buffer layer 120. The switching semiconductor layer 131 and the driving semiconductor layer 132 may include, or may be formed of, the following, for example: a polycrystalline silicon layer; an amorphous silicon layer; an oxide semiconductor such as indium-gallium-zinc oxide (IGZO); and/or indium-zinc-tin oxide (IZTO).

For example, when the driving semiconductor layer 132 is formed of a polycrystalline silicon layer, the driving semiconductor layer 132 may include a channel region 135 that is not doped with impurities, and may include a source region 136 and a drain region 137 that are respectively doped with p-type materials, and that are located at respective sides of the channel region 135. The ions used for doping may be p-type impurities, such as boron (B), and in particular, diborane ($B_2H_6$) may be used. Such impurities may vary based on the type of the thin film transistor.

Although a p-type metal oxide semiconductor (PMOS) TFT using p-type impurities is described as the driving TFT 20 in the present embodiment, the type of the driving TFT 20 is not limited thereto. Accordingly, the driving TFT 20 may also use one of an n-type metal oxide semiconductor (NMOS) TFT, and a complementary metal oxide semiconductor (CMOS) TFT.

A gate insulating layer 140 is on the switching semiconductor layer 131 and on the driving semiconductor layer 132. The gate insulating layer 140 may be formed of, for example, one or more of the following: tetraethyl orthosilicate (TEOS); silicon nitride ($SiN_x$); and/or silicon oxide ($SiO_2$). For example, the gate insulating layer 140 may have a double-layer structure in which a silicon nitride ($SiN_x$) layer having a thickness of about 40 nm, and a tetraethyl orthosilicate (TEOS) layer having a thickness of about 80 nm, are sequentially stacked.

A gate wiring including gate electrodes 152 and 155 is formed on the gate insulating layer 140. The gate wiring may further include a gate line 151, a first capacitor plate 158, and other wiring(s). The gate electrodes 152 and 155 respectively overlap at least respective portions of the switching semiconductor layer 131 and the driving semiconductor layer 132 (e.g., the channel region 135 of the driving semiconductor layer 132). The gate electrodes 152 and 155 may block impurities from being doped in the channel region 135 during the formation of the switching semiconductor layer 131 and the driving semiconductor layer 132 when the impurities are doped in the source region 136 and the drain region 137 of the switching semiconductor layer 131 and the driving semiconductor layer 132.

The gate electrodes 152 and 155 and the first capacitor plate 158 may be formed on the same layer (e.g., on the gate insulating layer 140), and may be formed of substantially the same metal. The gate electrodes 152 and 155 and the first capacitor plate 158 may be formed of one or more of the following: molybdenum (Mo); chromium (Cr); and/or tungsten (W).

An insulating interlayer 160 is on the gate insulating layer 140 to cover the gate electrodes 152 and 155. The insulating interlayer 160 may be formed of one or more of the following: silicon nitride ($SiN_x$); silicon oxide ($SiO_2$); and/or tetraethyl orthosilicate (TEOS), as in the gate insulating layer 140. However, it should be noted that the present invention is not limited thereto.

A data wiring including source electrodes 173 and 176 and drain electrodes 174 and 177 is on the insulating interlayer 160. The data wiring may further include a data line 171, a common power line 172, a second capacitor plate 178, and other wiring(s). The source electrodes 173 and 176 may be respectively connected to the source regions (e.g., source region 136) of the semiconductor layers 131 and 132, and the drain electrodes 174 and 177 may be respectively connected to the drain regions (e.g., drain region 137) of the semiconductor layers 131 and 132, through respective contact holes formed in the gate insulating layer 140 and in the insulating interlayer 160.

A planarization layer 180 covers the data line 171, the common power line 172, the source electrodes 173 and 176, the drain electrodes 174 and 177, and the second capacitor plate 178, which are formed over the insulating interlayer 160. The planarization layer 180 may remove a step difference, and may planarize a surface of the insulating interlayer 160 to enhance the light emission efficiency of the OLED 40 to be formed on the planarization layer 180. The planarization layer 180 may be formed of one or more of the following: a polyacrylate resin; an epoxy resin; a phenolic resin; a polyamide resin; a polyimide resin; an unsaturated polyester resin; a polyphenylenether resin; a polyphenylenesulfide resin; and/or benzocyclobutene (BCB).

As such, the switching TFT 10 may include the switching semiconductor layer 131, the gate electrode 152 (e.g., a switching gate electrode), the source electrode 173 (e.g., a switching source electrode), and the drain electrode 174 (e.g., a switching drain electrode). The driving TFT 20 may include the driving semiconductor layer 132, the gate electrode 155 (e.g., a driving gate electrode), the source electrode 176 (e.g., a driving source electrode), and the drain electrode 177 (e.g., a driving drain electrode). The configuration(s) of the switching TFT 10 and the driving TFT 20 is not limited to the aforementioned description, and is susceptible to various modifications known in the art, and may be easily applicable by those skilled in the art. In addition, the capacitor 30 includes the first capacitor plate 158 and the second capacitor plate 178, which oppose each other while having the insulating interlayer 160 therebetween.

In the present embodiment, the insulating interlayer 160 may be a dielectric material, and capacitance of the capacitor 30 may be determined by an amount of electric charge accumulated in the capacitor 30, and by the voltage across the first and second capacitor plates 158 and 178.

The switching TFT 10 may be used as a switching element for selecting a pixel to emit light. The switching gate electrode 152 is connected to the gate line 151. The switching source electrode 173 is connected to the data line 171. The switching drain electrode 174 is spaced from the switching source electrode 173, and is connected to the first capacitor plate 158.

The driving TFT 20 applies a driving power to a first electrode 210, and the driving power allows the OLED 40 within the selected pixel to emit light. The driving gate electrode 155 is connected to the first capacitor plate 158. The driving source electrode 176 and the second capacitor plate 178 are connected to the common power line 172. The driving drain electrode 177 is connected to the first electrode 210 of the OLED 40 through a contact hole (e.g., a contact hole 181 in the planarization layer 180).

Due to such a configuration, the switching TFT 10 may be operated by a gate voltage applied to the gate line 151 to thereby transmit a data voltage applied to the data line 171 to the driving TFT 20. A voltage equivalent to a difference between a common voltage applied from the common power line 172 to the driving TFT 20, and the data voltage transmitted from the switching TFT 10, may be stored in the capacitor 30. A current corresponding to the voltage stored in the capacitor 30 may flow into the OLED 40 through the driving TFT 20, such that the OLED 40 may emit light.

The OLED 40 includes the first electrode 210, an organic light emitting layer 230 on the first electrode 210, and a second electrode 240 on the organic light emitting layer 230.

At least one first electrode 210 may be formed in each pixel region. The first electrode 210 of the OLED 40 is formed on the planarization layer 180, and is connected to the drain electrode 177 through a contact hole 181 formed in the planarization layer 180.

A pixel defining layer 220 defining the pixel region by exposing at least a portion of the first electrode 210 is formed on the planarization layer 180. The pixel defining layer 220 may be formed of a resin such as a polyacrylate resin or a polyimide resin.

The organic light emitting layer 230 is formed on the first electrode 210 within the pixel region, and the second electrode 240 is formed on the pixel defining layer 220 and the organic light emitting layer 230. The organic light emitting layer 230 may be formed of one of a low molecular weight organic material, and a high molecular weight organic material. At least one of a hole injection layer (HIL) and a hole transporting layer (HTL) may further be interposed between the first electrode 210 and the organic light emitting layer 230, and at least one of an electron transporting layer (ETL) and an electron injection layer (EIL) may further be interposed between the organic light emitting layer 230 and the second electrode 240.

The first electrode 210 and the second electrode 240 may include one of a transmissive electrode, a transflective electrode, and a reflective electrode. The transmissive electrode may be formed of transparent conductive oxide (TCO), which may include at least one of indium-tin oxide (ITO), indium-zinc oxide (IZO), antimony-tin oxide (ATO), aluminum-zinc oxide (AZO), zinc oxide (ZnO), and/or a compound thereof.

The transflective electrode and/or the reflective electrode may be formed of magnesium (Mg), silver (Ag), gold (Au), calcium (Ca), lithium (Li), chromium (Cr), aluminum (Al), copper (Cu), and/or an alloy thereof. In the present embodiment, whether the electrode is transflective or reflective may be determined based on the thickness of the electrode. In general, the transflective electrode may have a thickness of about 200 nm or less, and the reflective electrode may have a thickness of about 300 nm or greater. As the thickness of the transflective electrode decreases, the light transmittance thereof increases, and the resistance thereof increases. Further, as the thickness of the transflective electrode increases, the light transmittance thereof decreases. In addition, the transflective and reflective electrodes may have a multilayer structure including a metal layer formed of a metal or a metal alloy, and a transparent conductive oxide (TCO) layer stacked on the metal layer.

A capping layer 250 is formed on the second electrode 240 to protect the OLED 40 prior to forming a thin film encapsulation layer 300, and to prevent damage to the OLED 40 during the formation of the thin film encapsulation layer 300. The capping layer 250 may have a single layer, or may have two or more layers, and may serve to block moisture or oxygen. Alternatively, the capping layer 250 may be omitted, and an organic layer 320 of the thin film encapsulation layer 300 may be formed in lieu of the capping layer 250.

The thin film encapsulation layer 300 is formed on the capping layer 250, and may include at least one inorganic layer 310 and at least one organic layer 320. Further, the thin film encapsulation layer 300 may have a structure in which the inorganic layer 310 and the organic layer 320 are alternately stacked. In this regard, one of the inorganic layers 310 may be positioned in the lowermost portion of the thin film encapsulation layer 300. The thin film encapsulation layer 300 may have a thickness of about 10 μm or less. The numbers of the inorganic layers 310 and the organic layers 320 are not limited to the example illustrated in FIG. 5.

The inorganic layer 310 may include at least one of aluminum oxide and silicon oxide. The organic layer 320 may include at least one of epoxy, acrylate, and urethane acrylate. The inorganic layer 310 may suppress infiltration of moisture and oxygen toward the flexible display panel 100, and the organic layer 320 may alleviate stress within the inorganic layer 310 and/or may fill minute cracks, pin holes, and the like formed in the inorganic layer 310.

As set forth above, in a display device according to one or more exemplary embodiments, a polarizing unit has increased transmittance at a corresponding position, such that a rate of degradation of an OLED at a corresponding position may be slackened. Further, image sticking phenomenon caused by degradation of the OLED may be significantly reduced.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention as set forth in the following claims and their equivalents.

What is claimed is:

1. A display device comprising:
a display panel having a display surface for producing images, the display surface having pixels for emitting light to produce the images, the display panel comprising:
a first substrate;
a thin film transistor on the first substrate; and
an organic light emitting diode on the thin film transistor; and
a polarizing unit on the display surface of the display panel, the polarizing unit comprising a linear polarizer that comprises at least two portions through which light is emitted to produce the images, the at least two portions comprising:
a first portion having a first transmittance, and located at a center portion of the display surface of the display panel; and
a second portion having a second transmittance that is higher than the first transmittance,
wherein the first and the second portions overlap the display surface of the display panel, an entirety of the second portion covering the pixels,
wherein the second portion is stacked on the organic light emitting diode, and the organic light emitting diode is stacked on the thin film transistor,
wherein the second portion comprises first, second, third, and fourth sub-portions,
wherein the first to fourth sub-portions are located at first, second, third and fourth corner portions of the display surface, respectively,
wherein the first sub-portion is adjacent to the second sub-portion in a first direction,
wherein the third sub-portion is adjacent to the fourth sub-portion in the first direction,
wherein the first sub-portion is adjacent to the third sub-portion in a second direction crossing the first direction,
wherein the second sub-portion is adjacent to the fourth sub-portion in the second direction, and
wherein a first distance between the first sub-portion and the second sub-portion is greater than a second distance between the first sub-portion and the third sub-portion.

2. The display device of claim 1, wherein the linear polarizer comprises:
a polyvinyl alcohol-based ("PVA-based") resin; and
a dichroic dye dyed to the PVA-based resin.

3. The display device of claim 2, wherein the PVA-based resin comprises:
a homopolymer of vinyl acetate; or
a copolymer of vinyl acetate and another monomer.

4. The display device of claim 2, wherein the dichroic dye comprises iodine.

5. The display device of claim 1, wherein the polarizing unit comprises:
an adhesive layer on the display panel; and
a phase retardation layer on the adhesive layer.

6. The display device of claim 1, wherein the organic light emitting diode comprises:
a first electrode on the first substrate;
an organic light emitting layer on the first electrode; and
a second electrode on the organic light emitting layer.

7. The display device of claim 6, further comprising a thin film encapsulation layer on the second electrode, the thin film encapsulation layer comprising at least one organic layer alternately stacked with at least one inorganic layer.

8. The display device of claim 1, wherein a dichroic dye has been selectively detached from the second portion.

9. The display device of claim 1, wherein
the first to fourth sub-portions have the same shape, and
the first to fourth sub-portions have the same size.

10. A display device comprising:
a display panel having a display surface for producing images, the display surface having pixels for producing the images; and
a polarizing unit on the display surface of the display panel, the polarizing unit comprising a linear polarizer that comprises at least two portions for producing the images, the at least two portions comprising:
a first portion having a first transmittance, and located at a center portion of the display surface of the display panel; and a second portion having a second transmittance that is higher than the first transmittance,
wherein the first and the second portions overlap the display surface of the display panel,
wherein the display panel is configured to display a first image and a second image,
wherein the display panel is configured to display the first image at the display surface corresponding to the second portion and is configured to continuously display the second image for a certain period at the display surface corresponding to the second portion,
wherein an entirety of the second portion covers the pixels, and
wherein the display panel is an organic light emitting diode (OLED) display panel.

* * * * *